(12) United States Patent
Choudhury

(10) Patent No.: US 7,852,281 B2
(45) Date of Patent: Dec. 14, 2010

(54) INTEGRATED HIGH PERFORMANCE PACKAGE SYSTEMS FOR MM-WAVE ARRAY APPLICATIONS

(75) Inventor: Debabani Choudhury, Thousand Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 250 days.

(21) Appl. No.: 12/215,990

(22) Filed: Jun. 30, 2008

(65) Prior Publication Data

US 2009/0322643 A1 Dec. 31, 2009

(51) Int. Cl.
*H01Q 1/52* (2006.01)
*H01Q 1/38* (2006.01)
(52) U.S. Cl. .................. 343/851; 343/700 MS
(58) Field of Classification Search .......... 343/700 MS, 343/702, 850, 853, 893, 851
See application file for complete search history.

(56) References Cited

U.S. PATENT DOCUMENTS 4,316,194 A * 2/1982 De Santis et al. ..... 343/700 MS

2008/0159364 A1* 7/2008 Rofougaran ................ 375/219
2009/0231225 A1* 9/2009 Choudhury et al. ......... 343/770

OTHER PUBLICATIONS

Choudhury, Debabani, et al, U.S. Appl. No. 11/874,899, filed Oct. 17, 2007.
Suh, Seong-Youp, et al, U.S. Appl. No. 11/693,013, filed Mar. 29, 2007.
Choudhury, Debabani, U.S. Appl. No. 11/807,987, filed May 31, 2007.
Choudhury, Debabani; "Wireless Antenna Array System Architecture and Methods to Achieve 3D Beam Coverage"; U.S. Appl. No. 12/215,542, filed Jun. 27, 2008.
Gaucher, B., et al "MM-Wave Transceivers Using Sige HBT Technology", IEEE 2004, pp. 81-84.
Lee, Johg-Hoon, et al Highly Integrated Millimeter-Wave Passive Components Using 3-D LTCC System-On-Package (SOP) Technology, IEEE vol. 53, No. 6, Jun. 2005, pp. 2220-2229.
Tentzeris, Manos M., "3-D-Integrated RF and Millimeter-Wave Funtions and Modules Using Liquid Crystal Polymer (LCP) System-On-Package Technology", IEEE vol. 27, No. 2, May 2004, pp. 332-340.

\* cited by examiner

*Primary Examiner*—Hoang V Nguyen
(74) *Attorney, Agent, or Firm*—Scott M. Lane

(57) ABSTRACT

Embodiments of integrated high performance package systems for millimeter-wave array applications are described herein. Other embodiments may be described and claimed.

20 Claims, 4 Drawing Sheets

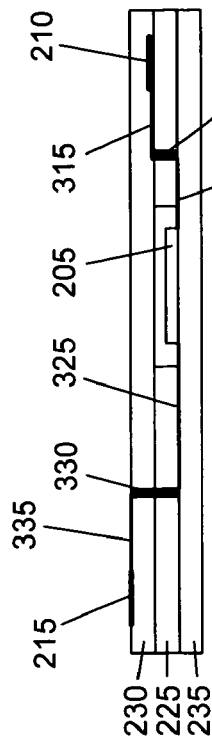
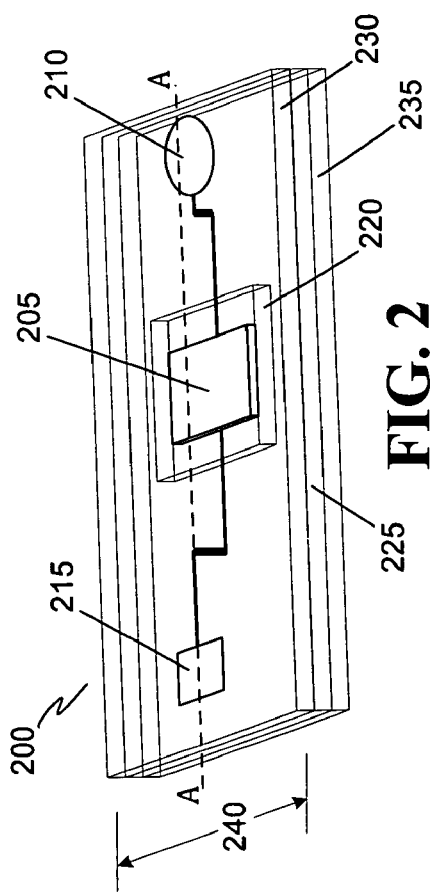
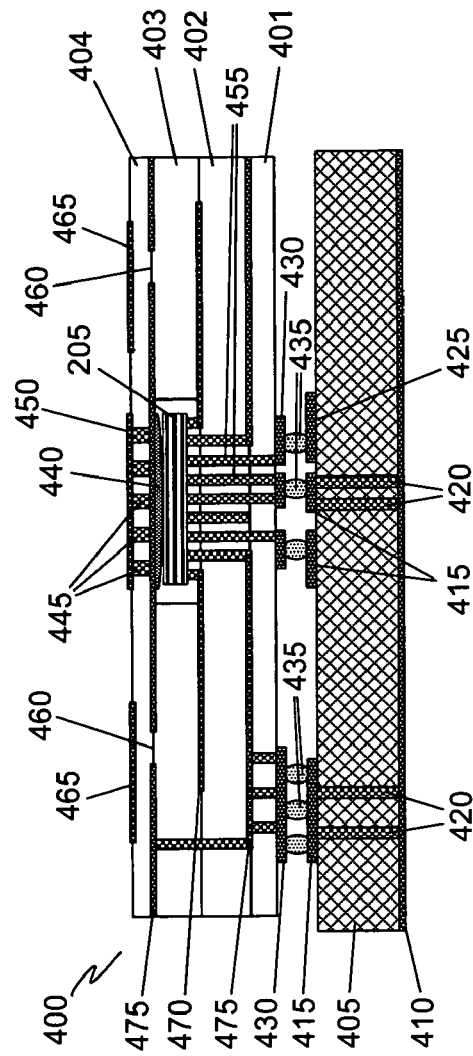

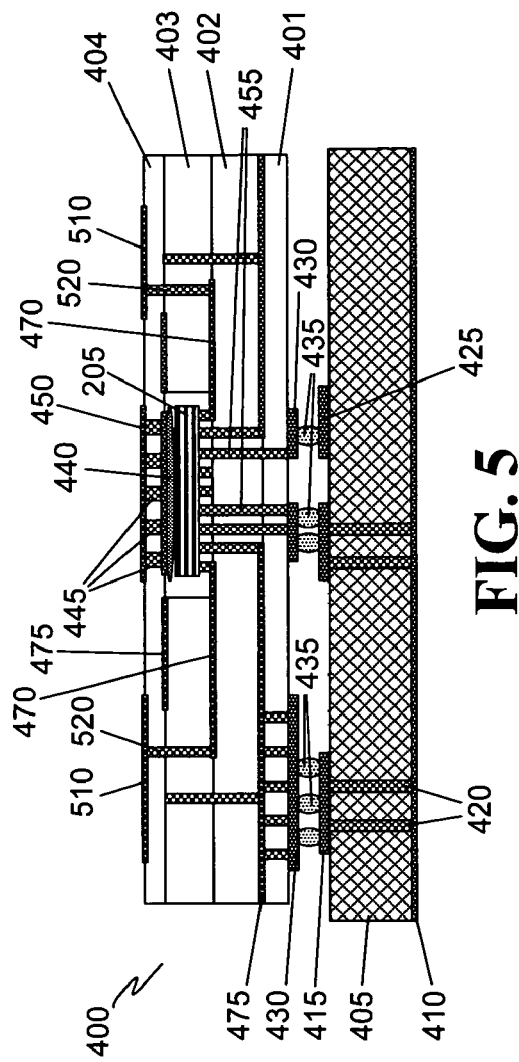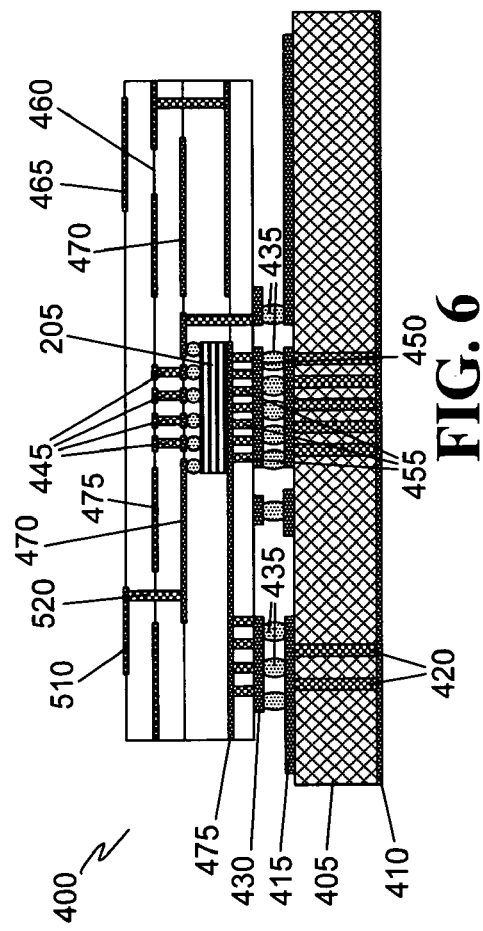

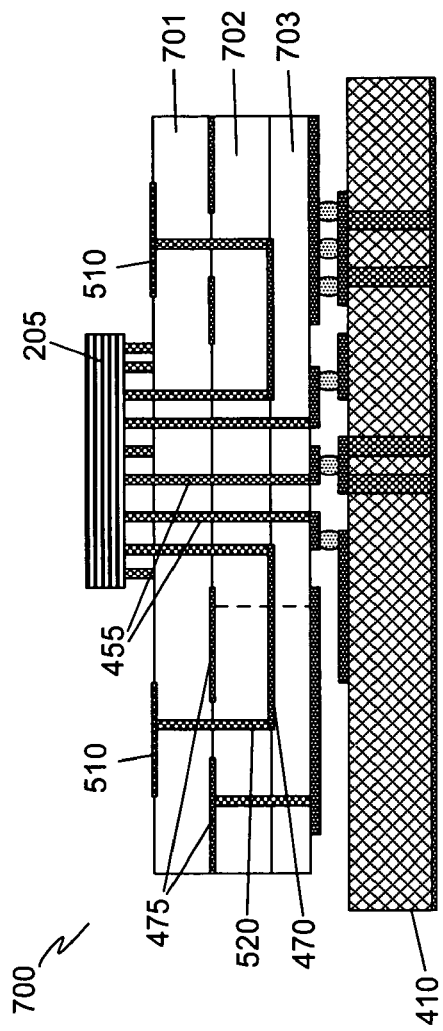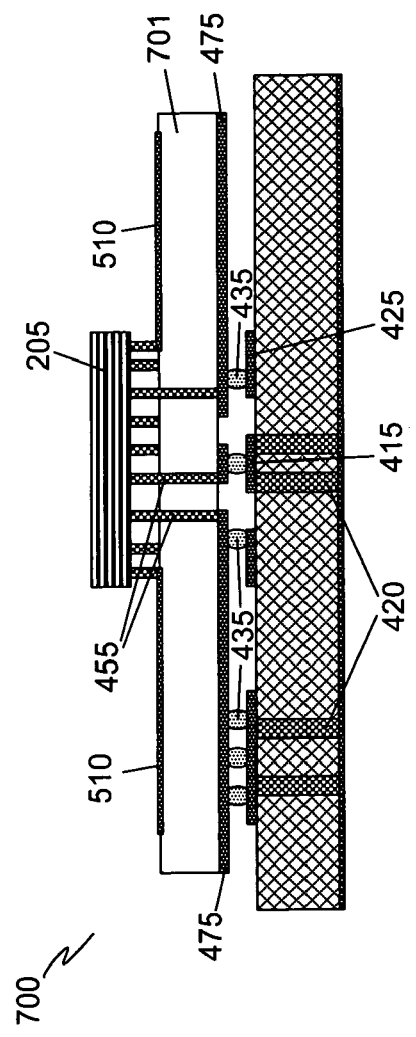

INTEGRATED HIGH PERFORMANCE PACKAGE SYSTEMS FOR MM-WAVE ARRAY APPLICATIONS

FIELD OF THE INVENTION

The field of invention relates generally to a wireless antenna array system and more specifically but not exclusively relates to a modular wireless system architecture for transmitting and receiving millimeter-wave (mm-wave) signals in WPAN/WLAN environments.

BACKGROUND INFORMATION

Technological developments permit digitization and compression of large amounts of voice, video, imaging, and data information. The need to transfer data between devices in wireless mobile radio communication requires transmission of an accurate data stream at a high data rate. An extremely high frequency electromagnetic energy band with wavelengths approximately between 1 millimeter and 10 millimeters may be used to transfer large amounts of data wirelessly. One segment of the extremely high frequency band, a 60 gigahertz (GHz) band ranging between 57 and 64 gigahertz (GHz), may be used for high data rate millimeter-wave (mm-wave) communications.

BRIEF DESCRIPTION OF THE DRAWINGS

The present invention is illustrated by way of example and not as a limitation in the figures of the accompanying drawings, in which:

FIG. 2 is an isometric view of an integrated high performance package system for mm-wave array applications in accordance with some embodiments of the present invention.

FIG. 3 is a cross-sectional illustration of the integrated high performance package system of FIG. 2.

FIGS. 4 to 6 are cross-sectional illustrations of alternate embodiments of integrated high performance package systems wherein an integrated circuit is positioned within the package.

FIGS. 7 and 8 are cross-sectional illustrations of alternate embodiments of integrated high performance package systems wherein the integrated circuit is positioned on the package.

DETAILED DESCRIPTION

Figure 1:
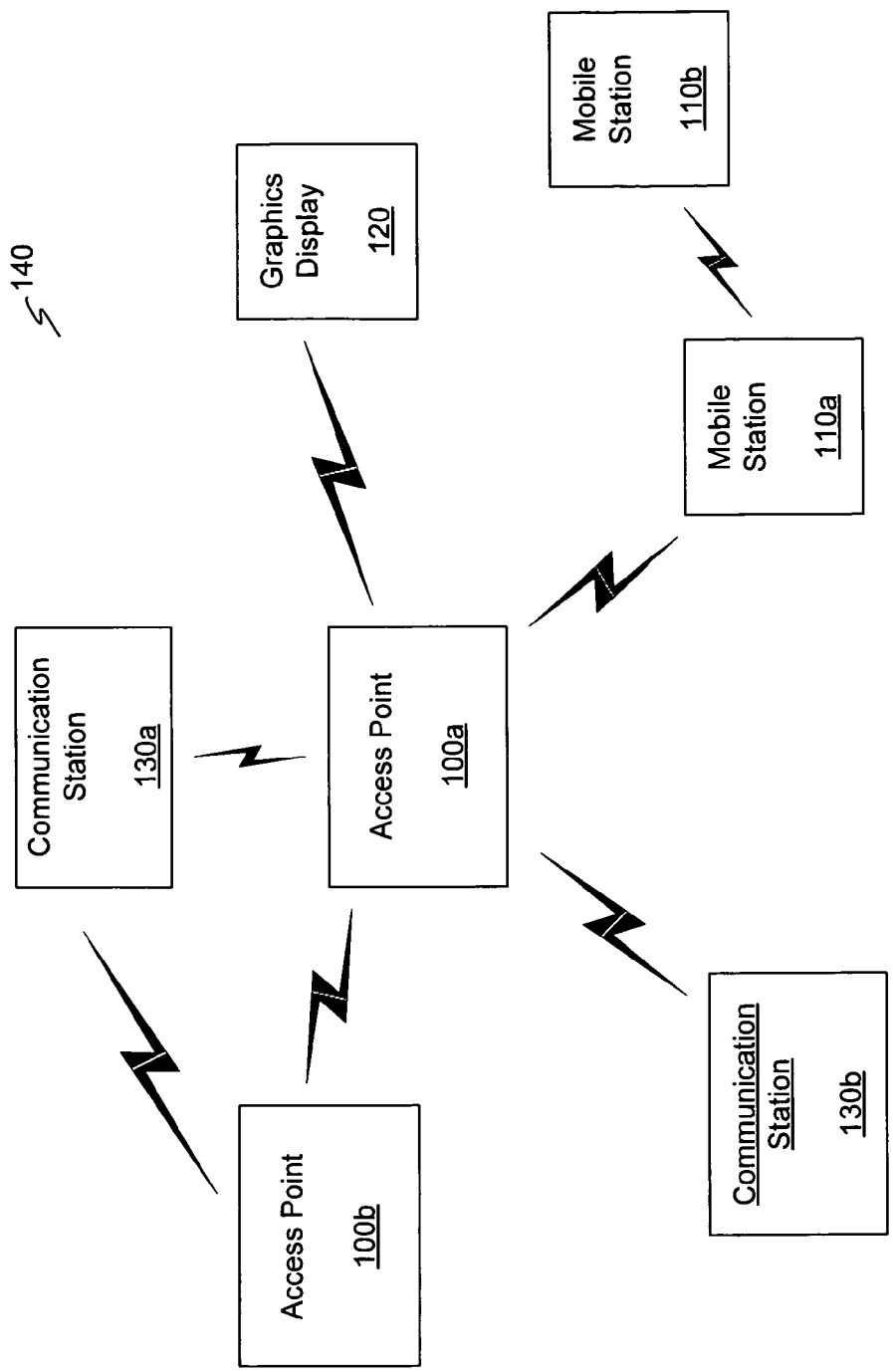
FIG. 1 is a block diagram illustrating devices using extremely high frequency radio signals to communicate in a wireless network.

In the following detailed description, numerous specific details are set forth to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of methods and systems for using integrated high performance package systems for millimeter-wave array applications are described herein. In the following description, numerous specific details are set forth, such as a description of millimeter-wave (mm-wave) communication package structures to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

It would be an advance in the art to provide compact and easy to assemble, yet low cost millimeter wave wireless devices that are designed to operate using local area network (WLAN) and wireless personal area network (WPAN) technologies. MM-wave communication using extremely high frequency radio signals is desirable because it provides relatively high communications throughput while allowing for high frequency reuse potential.

Existing mm-wave communication techniques and systems employing coplanar waveguides and/or unshielded transmission structures fail to provide a compact yet low cost solution for communication devices using extremely high frequency radio signals. Unshielded transmission lines demonstrate quasi-transverse electromagnetic characteristics and suffer performance degradation when placed in close proximity to other structures in a compact packaging scenario. High performance waveguide structures, including plastic-based metallized structures, have been proposed for compact packaging. However, use of waveguides result in bulky structures in most designs.

Antennas designed to communicate using extremely high frequency radio signals with small wavelengths may be designed using small form factor packages due to a small beam width and corresponding antenna profiles, allowing for a compact antenna array architecture. Providing a low cost and compact antenna array capable of operating using mm-wave frequency radio signals, for example an unlicensed short range frequency band with data throughputs up to 5-10 gigabit per second, would enable more efficient form factor design of access point or consumer electronic and handheld devices while providing increased operability in a variety of applications. As a result, bulky antenna array systems inherent to existing antenna types are avoided. Access points or devices employing extremely high frequency radio signals in a high bandwidth wireless communication environment may enjoy multidirectional wireless coverage from a low-cost, yet compact antenna array system. The access point may comprise a host processor coupled to each of a flash memory device, random access memory (RAM), and a radio frequency interface comprising one or more embodiments of a millimeter-wave (mm-wave) communication device described herein.

Embodiments of 60 GHz band ((57-66 GHz) millimeter-wave (mm-wave) communications devices may be used in a variety of applications. Some embodiments of the invention may be used in conjunction with various devices and systems, for example, a transmitter, a receiver, a transceiver, a wireless communication station, a wireless communication device, a wireless Access Point (AP), a modem, a wireless modem, a Personal Computer (PC), a desktop computer, a mobile computer, a laptop computer, a notebook computer, a tablet computer, a server computer, a set-top box, a handheld computer, a handheld device, a Personal Digital Assistant (PDA) device, a handheld PDA device, a mobile station (MS), a graphics display, a communication station, a network, a wireless network, a Local Area Network (LAN), a Wireless LAN (WLAN), a Metropolitan Area Network (MAN), a Wireless MAN (WMAN), a Wide Area Network (WAN), a Wireless WAN (WWAN), devices and/or networks operating in accordance with existing IEEE 802.11, 802.11a, 802.11b, 802.11e, 802.11g, 802.11 h, 802.11i, 802.11n, 802.16, 802.16d, 802.16e standards and/or future versions and/or derivatives and/or Long Term Evolution (LTE) of the above standards, a Personal Area Network (PAN), a Wireless PAN (WPAN), units and/or devices which are part of the above WLAN and/or PAN and/or WPAN networks, one way and/or two-way radio communication systems, cellular radio-telephone communication systems, a cellular telephone, a wireless telephone, a Personal Communication Systems (PCS) device, a PDA device which incorporates a wireless communication device, a Multiple Input Multiple Output (MIMO) transceiver or device, a Single Input Multiple Output (SIMO) transceiver or device, a Multiple Input Single Output (MISO) transceiver or device, a Multi Receiver Chain (MRC) transceiver or device, a transceiver or device having "smart antenna" technology or multiple antenna technology, or the like. Some embodiments of the invention may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carrier Modulation (MDM), Discrete Multi-Tone (DMT), Bluetooth® ZigBee™, or the like. Embodiments of the invention may be used in various other apparatuses, devices, systems and/or networks.

Turning now to the figures, FIG. 1 is a block diagram illustrating small form-factor devices, such as access points (100a & 100b), mobile stations (110a & 110b), a graphics display (120) and communication stations (130a & 130b) using extremely high frequency radio signals to communicate in an extremely high frequency wireless network 140. Access point 100a may communicate with another access point 100b and communication stations, such as communication stations (CS) 130a and 130b. The CSs 130a and 130b may be fixed or substantially fixed devices. In some embodiments, access points 100a may use millimeter-wave signals for communicating, although the scope of the invention is not limited in this respect. Access point 100a may also communicate with other devices such as mobile station 110a and graphics display 120. The access points (100a & 100b), mobile stations (110a & 110b), a graphics display (120) and communication stations (130a & 130b) may each comprise a host processor coupled to each of a flash memory device, random access memory (RAM), and a radio frequency interface comprising one or more embodiments of a millimeter-wave (mm-wave) communication device described herein.

In some embodiments, access point 100a and mobile station 110a operate as part of a peer-to-peer (P2P) network. In other embodiments access point 100a and mobile station 110a operate as part of a mesh network, in which communications may include packets routed on behalf of other wireless devices of the mesh network, such as mobile station 110b. Fixed wireless access, wireless local area networks, wireless personal area networks, portable multimedia streaming, and localized networks such as an in-vehicle networks, are some examples of applicable P2P and mesh networks.

The small form-factor devices such as the access points (100a & 100b), mobile stations (110a & 110b), graphics display (120) and communication stations (130a & 130b) may communicate using extremely high frequency radio signals transmitted and received through a through a wireless antenna array assembly, such as the mm-wave communications system 200 of FIG. 2. FIG. 2 illustrates a mm-wave communications system 200 with a small form factor while providing low loss mm-wave routing for extremely high frequency applications in accordance with some embodiments of the invention.

The mm-wave communications system 200 comprises an integrated circuit (IC) 205 connected to a first antenna 210 and a second antenna 215. Two antennas are illustrated in FIG. 2, however the mm-wave communications system 200 may comprise a phased array antenna structure in a m×n configuration. In some embodiments, a phased array antenna structure may provide desired transmission and/or reception coverage for an access point 100, mobile station 110, graphics display, and/or communications station 130.

In one embodiment, the IC 205 is a mm-wave phased array front-end which amplifies and converts mm-wave signals to and/or from approximately 1-6 GHz frequencies for baseband and digital data. The IC 205 may consist of phased array elements, amplifiers, filters, frequency converters and other integrated circuit components. In the embodiment shown in FIG. 2, the IC 205 is positioned in a recess 220 formed in a first packaging substrate 225 and adjacent to a second packaging substrate 230 and a third packaging substrate 235. In one embodiment, the first packaging substrate 225, second packaging substrate 230, and third packaging substrate 235 range approximately between 25 and 100 micrometers in one embodiment and preferably between 25 and 50 micrometers (μm) in thickness, though the embodiment is not so limited. The integrated circuit (IC) 205 may be connected to the third packaging substrate 235 and/or the second packaging substrate 230 using a flip-chip process, a wire-bond process, or another chip attachment process known to one skilled in the art. The recess 220 as shown in FIG. 2 is a rectangular cavity, however other shapes may be selectively designed based on mm-wave communications system 200 shape and size. For example, in another embodiment the recess 220 extends across a width 240 of the first packaging substrate 225. In a further embodiment, the recess 220 is formed in a U-shaped pattern in the first packaging substrate 225.

The IC 205 may be formed from group III and IV semiconductor technology such as Gallium Arsenide (GaAs) and Indium Phosphide (InP). Alternately, the IC 205 may be formed from Silicon Germanium (SiGe) or complimentary metal-oxide semiconductor (CMOS) silicon technology. CMOS technology provides low cost and highly integrated solutions, whereby RF building blocks, active and passive elements are integrated on the same chip, as compared to other available technologies. One IC 205 is illustrated in this embodiment, however a plurality of ICs 205 may be used in the mm-wave communications system 200.

The first packaging substrate 225, second packaging substrate 230 and third packaging substrate 235 may be derived from the same material type or the material types may be selectively designed depending on a mm-wave communications system 200 application. For example, the material type for the first packaging substrate 225, second packaging substrate 230, and/or third packaging substrate 235 may be formed from a high frequency material type such as a laminate, ceramic, semi-insulating (SI)-silicon, low-loss-organics such as liquid crystal polymer (LCP), and a Rogers Corporation RO-series material such as an RO4000® Series High Frequency Circuit Material comprising a woven glass reinforced/ceramic filled thermoset material with a very high glass transition temperature. Generally, the first packaging substrate 225, second packaging substrate 230, and third packaging substrate 235 are selected based on physical, electrical, and chemical characteristics such as a thermal expansion coefficient so they may be compatible with one another in the mm-wave communications system 200 and a selected mm-wave application, such as those described in FIG. 1.

In this embodiment, a first antenna 210 is affixed to a surface of a first packaging substrate 225. In another embodiment, the first antenna 210 may be combined with additional antennas (not shown) on the first packaging substrate 225 and configured to form a planar antenna array on the first packaging substrate 225. Also in this embodiment, a second antenna 215 is affixed to a surface of the second packaging substrate 230. In another embodiment, the second antenna 215 may be combined with additional antennas (not shown) on the second packaging substrate 230 and configured to form a planar antenna array on the second substrate 230. The first antenna 210 and the second antenna 215 may be a planar dipole type antenna that is low profile, low cost, and light weight. Other mm-wave antennas may also be used for the first antenna 210 and/or the second antenna 215 such as slot, microstrip patch, coplanar waveguide patch, and/or spiral type planar structures selectively designed for signals with wavelengths between 1 millimeter and 10 millimeters (mm). In one embodiment, the free-space wavelength at 60 GHz is approximately 5 mm.

FIG. 3 is a cross-sectional illustration through section line A-A of the mm-wave communications system 200 of FIG. 2. In this embodiment, the IC 205 is connected to the first antenna 210 using a first stripline 305, a first via 310, and a first microstrip 315. In this embodiment, the first via 310 connects the first stripline 305 to the first microstrip 315. A stripline is one form of a low-loss shielded transmission line used for routing to convey mm-wave high frequency radio signals. The stripline is formed of a conductive material, for example one or more metals such as copper (Cu) or gold (Au), sandwiched between two ground elements such as ground planes (not shown). The ground planes may be on or embedded in the packaging substrates such as the first packaging substrate 225, second packaging substrate 230, and third packaging substrate 235. The ground planes may be used to electromagnetically isolate integrated circuit leads from the mm-wave high frequency radio signals. A microstrip is an alternate type of low-loss transmission line that may be partially shielded and used for routing of mm-wave high frequency radio signals. The microstrip is a conductive material formed on a dielectric layer that separates the microstrip from a ground element such as a ground plane (not shown).

Also in this embodiment, the IC 205 is connected to the second antenna 215 using a second stripline 325, a second via 330, and a second microstrip 335. Placement, sizing, and routing of the striplines and microstrips are configured for efficient routing to be incorporated in the mm-wave communications system for an intended application or range of applications. One skilled in the art will appreciate that the complexity of stripline and microstrip routing increases as density of striplines, microstrips, and antenna elements within a mm-wave communications system 200 increases. A minimization of cross-talk between the elements is desired, especially for non-shielded or partially shielded elements such as microstrips, coplanar waveguides and slot lines.

FIGS. 4 to 6 are cross-sectional illustrations of alternate embodiments of a multilayer package 400 wherein an integrated circuit 205 is internally positioned on or within package substrates 401 through 404. Embedding the integrated circuit 205 within the multilayer package 400 may protect and shield the integrated circuit 205 from physical, chemical, magnetic, and electrical interference and/or damage. MM-wave radios benefit from incorporating RF front end antennas with minimal interconnection length. As a result, losses from lengthy and expensive interconnects are reduced. Each package substrate 401, 402, 403, and 404 may be formed from one or more laminates, ceramics, semi-insulating (SI)-silicon, low-loss-organics such as liquid crystal polymer (LCP), and a Rogers Corporation RO-series material such as an RO4000® Series High Frequency Circuit Material comprising a woven glass reinforced/ceramic filled thermoset material with a very high glass transition temperature. The package substrates 401, 402, 403, and 404 may all be formed of a single material or they may each be selectively designed to be formed of different materials.

The multilayer packages 400 illustrated in FIGS. 4 to 6 are configured to reduce transmission line, via connection, and transitional losses. FIG. 4 illustrates a cross-section of a multilayer package 400 with stripline and microstrip routing embedded in package substrates 401 through 404, configured to operate in the 60 GHz millimeter-wave band ((57-66 GHz) while substantially or completely shielding the integrated circuit 205 from outside electromagnetic/RF interference. In this embodiment, a coupling slot 460 is configured to provide a slot coupled patch antenna 465, fed by a patch antenna stripline 470, around the integrated circuit 205. Ground elements 475 are efficiently routed and situated in this embodiment below the slot coupled patch antenna 465 and the patch antenna stripline 470.

Thermal management of the integrated packaging system 400 is enabled by providing a heat transfer path through a thermally conductive paste 440, a plurality of heatsink vias 445, and an optional heatsink 450. Application of a conductive paste 440, though optional, may enhance heat transfer from the integrated circuit to the heatsink 450. The integrated circuit 205 may be positioned in the multilayer package 400 using a flipchip assembly process. Connectivity to the multilayer package 400 from a base layer 410 is provided through a base substrate 405 using RF ground vias 420 and RF pads 415, which may also provide thermal transfer to and from the multilayer package 400 through integrated circuit leads 455. The base substrate 405 may be formed from one or more of an organic epoxy-glass resin based materials such as bismaleimide-triazine (BT) resin, Ajinomoto Build-up Film (ABF), Flame Retardant 4 epoxy (FR4), and other materials suitable for the downconverted frequency or another conventional material known to one skilled in the art for down-converted intermediate frequencies in a range approximately between 1 GHz to 15 GHz. MM-wave systems can use downconverted frequency values within a range approximately between 2 GHz to 16 GHz depending on the selected system requirements. Direct current (DC) may be routed through the integrated circuit leads 455 from a DC pad 425. The base substrate 405 may be a component on or within the access points (100a & 100b), the mobile stations (110a & 110b), the graphics display (120) and/or the communication stations (130a & 130b), which are configured to communicate using extremely high frequency radio signals transmitted and received through a wireless antenna array assembly, such as the multilayer package 400.

Connection from the RF pads 415 and DC pad 425 to integrated package pads 430 may be provided through a plurality of solder bumps 435. The solder bumps 435 in electrical contact between the RF pads 415 and integrated package pads 430 and between the DC pad 425 and integrated package pads 430 form an interconnect between the multilayer package 400 and the base layer 410. Flux may first be applied before positioning the multilayer package 400 on the base layer 410. The solder bumps 435 of FIG. 4 are oblong spheres, though the embodiment is not so limited. Other solder shapes such as cylindrical pins or circular spheres may also be used.

The solder bumps 435 may be reflowed by thermal treatment using a selectively designed thermal process to reflow solder. The solder bumps 435 may be formed using one or more materials that are effectively non-collapsible such as Cu and Sn/Ag alloys. In another embodiment, the solder bumps 435 are formed of another fusible metal alloy comprising tin, copper, silver, bismuth, indium, zinc, and/or antimony.

FIG. 5 illustrates an alternate embodiment of a cross-section of a multilayer package 400 with a stripline/via patch antenna positioned around the integrated circuit 205. In this embodiment, the integrated circuit 205 is connected to a patch antenna 510 using a patch antenna stripline 470 and a patch via 520. Ground elements 475 embedded in the packaging substrates are positioned below the patch antenna stripline 470 and the patch antenna 510. FIG. 6 illustrates a further embodiment of a cross-section of an multilayer package 400 with a patch antenna 510 and a slot coupled patch antenna 465 positioned around the integrated circuit 205. The heatsink 450 is oriented on a lower surface of the multilayer package 400 in this embodiment.

FIG. 7 illustrates a cross-section of a top-mount multilayer package 700 with the integrated circuit 205 on substrates 701 through 703 configured to operate in the 60 GHz millimeter-wave band ((57-66 GHz). In this embodiment, the integrated circuit 205 is connected to the top-mount multilayer package 700 using a flipchip assembly process. The integrated circuit 205 is connected to a patch antenna 510 using a patch antenna stripline 470 and a patch via 520. Ground elements 475 are positioned below the patent antenna stripline 470 and the patch antenna 510.

FIG. 8 illustrates another embodiment of a cross-section of a top-mount multilayer package 700 with the integrated circuit 205 on substrate 701. The integrated circuit 205 is connected to a patch antenna 510 using the integrated circuit leads 455. Ground elements 475 are positioned below the patch antennas 510.

While specific embodiments of, and examples for, the invention are described herein for illustrative purposes, various equivalent modifications are possible within the scope of the invention, as those skilled in the relevant art will recognize. In the description and claims, the terms "coupled" and "connected," along with their derivatives, may have been used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Modifications may be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A millimeter-wave (mm-wave) communications system, comprising:
    an integrated circuit;
    a mm-wave antenna configured to communicate using mm-wave signals;
    a multilayer package comprising a plurality of package substrates for mm-wave routing and shielding;
    a shielded transmission line embedded in the multilayer package to connect the integrated circuit to the mm-wave antenna; and
    a plurality of integrated circuit leads configured to transmit low-frequency and direct current signals, wherein the integrated circuit leads are electromagnetically isolated from the mm-wave signals.

2. The mm-wave communications system of claim 1, further including a base substrate wherein intermediate frequency signals are supplied through the base substrate to the mm-wave communications system.

3. The mm-wave communications system of claim 2, wherein the intermediate frequency signals are less than 2 gigahertz (GHz).

4. The mm-wave communications system of claim 2, wherein the base substrate is selected from the group consisting of bismaleimide-triazine (BT), Ajinomoto Build-up Film (ABF), and Flame Retardant 4 epoxy (FR4).

5. The mm-wave communications system of claim 2, wherein the intermediate frequency signals are substantially between 4 GHz and 16 GHz.

6. The mm-wave communications system of claim 1, wherein the package substrates are selected from the group consisting of a laminate, ceramic, semi-insulating (SI)-silicon, low-loss-organic, a liquid crystal polymer (LCP), and Rogers RO-series materials.

7. The mm-wave communications system of claim 1, wherein the integrated circuit is embedded between a top package substrate and a bottom package substrate.

8. A system for 60 GHz band wireless communication, comprising:
    an integrated circuit to communicate in the 60 GHz band through a plurality of antennas using a first transmission line and a second transmission line, wherein a packaging substrate substantially isolates the first transmission line from an electromagnetic field of the second transmission line.

9. The system of claim 8, further including a base substrate wherein intermediate frequency signals are supplied through the base substrate to the system.

10. The system of claim 9, wherein the intermediate frequency signals are less than 2 GHz.

11. The system of claim 9, wherein the base substrate is selected from the group consisting of bismaleimide-triazine (BT), Ajinomoto Build-up Film (ABF), and Flame Retardant 4 epoxy (FR4).

12. The system of claim 9, wherein the intermediate frequency signals are substantially between 2 GHz and 16 GHz.

13. The system of claim 8, wherein the packaging substrate is selected from the group consisting of a ceramic, a laminate, semi-insulating (SI)-silicon, low-loss-organics, a liquid crystal polymer (LCP), and Rogers RO-series materials.

14. The system of claim 8, wherein the integrated circuit is embedded between a top substrate and a bottom substrate.

15. A wireless communications device, comprising:
    a host processor;
    a flash memory device;
    a random access memory; and
    a mm-wave communications system comprising an integrated circuit configured to communicate in a 60 GHz band through a plurality of antennas using a first transmission line and a second transmission line, wherein a packaging substrate substantially isolates the first transmission line from an electromagnetic field of the second transmission line.

16. The wireless communications device of claim 15, further including a base substrate wherein intermediate frequency signals are supplied through the base substrate to the mm-wave communications system.

17. The wireless communications device of claim 16, wherein the intermediate frequency signals are less than 2 GHz.

18. The wireless communications device of claim 16, wherein the base substrate is selected from the group consisting of bismaleimide-triazine (BT), Ajinomoto Build-up Film (ABF), and Flame Retardant 4 epoxy (FR4).

19. The wireless communications device of claim 16, wherein the intermediate frequency signals are substantially between 2 GHz and 16 GHz.

20. The wireless communications device of claim 15, wherein the packaging substrate are selected from the group consisting of a laminate, ceramic, semi-insulating (SI) -silicon, low-loss-organic, a liquid crystal polymer (LCP), and Rogers RO-series materials.

* * * * *